(12) United States Patent
Kobashi et al.

(10) Patent No.: US 12,317,669 B2
(45) Date of Patent: May 27, 2025

(54) LIGHT-EMITTING ELEMENT, LIGHT-EMITTING DEVICE, AND MANUFACTURING METHOD OF LIGHT-EMITTING ELEMENT FOR IMPROVING ELECTRON TRANSPORT EFFICIENCY

(71) Applicant: SHARP KABUSHIKI KAISHA, Sakai (JP)

(72) Inventors: Tadashi Kobashi, Sakai (JP); Masaki Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 621 days.

(21) Appl. No.: 17/619,150

(22) PCT Filed: Jul. 4, 2019

(86) PCT No.: PCT/JP2019/026742
§ 371 (c)(1),
(2) Date: Dec. 14, 2021

(87) PCT Pub. No.: WO2021/002021
PCT Pub. Date: Jan. 7, 2021

(65) Prior Publication Data
US 2022/0359845 A1    Nov. 10, 2022

(51) Int. Cl.
*H10K 50/11* (2023.01)
*H10K 50/115* (2023.01)
(Continued)

(52) U.S. Cl.
CPC .......... *H10K 50/11* (2023.02); *H10K 50/115* (2023.02); *H10K 50/16* (2023.02); *H10K 50/826* (2023.02);
(Continued)

(58) Field of Classification Search
CPC .... H10K 50/115; H10K 50/805; H10K 71/00; H10K 50/15; H10K 50/16;
(Continued)

(56) References Cited

U.S. PATENT DOCUMENTS 5,537,000 A * 7/1996 Alivisatos .............. B82Y 30/00
313/499
7,651,674 B2 * 1/2010 Jun ...................... C09K 11/565
977/773
(Continued)

FOREIGN PATENT DOCUMENTS

JP 2018-517247 A 6/2018

*Primary Examiner* — Caleb E Henry
(74) *Attorney, Agent, or Firm* — ScienBiziP, P.C.

(57) ABSTRACT

A light-emitting element includes, in sequence, an anode, a hole transport layer, a luminous layer containing a plurality of quantum dots, an electron transport layer, and a cathode. The electron transport layer includes a plurality of inorganic nanoparticles having electron transportability, and an organic layer having electron transportability. The organic layer partly contains the plurality of inorganic nanoparticles, and includes a plurality of first hollows in an interface adjacent to the luminous layer. The plurality of first hollows are filled with the plurality of quantum dots.

2 Claims, 7 Drawing Sheets

(51) Int. Cl.
  *H10K 50/16*    (2023.01)
  *H10K 50/81*    (2023.01)
  *H10K 50/826*   (2023.01)
  *H10K 59/12*    (2023.01)
  *H10K 71/00*    (2023.01)
  *H10K 85/10*    (2023.01)
  *H10K 85/30*    (2023.01)
  *H10K 85/60*    (2023.01)

(52) U.S. Cl.
  CPC ............ *H10K 71/00* (2023.02); *H10K 50/81* (2023.02); *H10K 59/12* (2023.02); *H10K 59/1201* (2023.02); *H10K 85/111* (2023.02); *H10K 85/1135* (2023.02); *H10K 85/326* (2023.02); *H10K 85/615* (2023.02); *H10K 85/633* (2023.02)

(58) Field of Classification Search
  CPC .. H10K 2102/00; H10K 50/155; H10K 50/11; H10K 50/826; H10K 50/81; H10K 59/12; H10K 59/1201; H10K 85/111; H10K 85/1135; H10K 85/326; H10K 85/615; H10K 85/633; H10K 2101/30; H10K 2102/331; H10K 2101/40; H01L 51/502; H01L 51/5203; H01L 51/56; H01L 51/5056; H01L 51/5072; H01L 2251/303; H05B 33/10; H05B 33/14
  See application file for complete search history.

(56) References Cited

U.S. PATENT DOCUMENTS

| | | | |
|---|---|---|---|
| 9,812,004 B1* | 11/2017 | Boshernitzan | G08C 17/02 |
| 9,831,706 B2* | 11/2017 | MacWilliams | H02J 7/32 |
| 9,874,693 B2* | 1/2018 | Baiocco | H01L 21/762 |
| 10,374,183 B2* | 8/2019 | Park | H10K 59/32 |
| 10,600,980 B1* | 3/2020 | Boardman | H10K 59/877 |
| 10,749,130 B2* | 8/2020 | Kim | H10K 50/805 |
| 2006/0039850 A1* | 2/2006 | Jun | C09K 11/08 |
| | | | 423/561.1 |
| 2010/0140586 A1* | 6/2010 | Char | C09K 11/883 |
| | | | 257/14 |
| 2012/0280345 A1* | 11/2012 | Zhu | G02B 6/1226 |
| | | | 257/E31.127 |
| 2013/0037778 A1* | 2/2013 | Kazlas | C09K 11/883 |
| | | | 257/E29.024 |
| 2014/0027816 A1* | 1/2014 | Cea | H01L 29/1054 |
| | | | 257/E29.085 |
| 2014/0061592 A1* | 3/2014 | Liu | H10K 85/654 |
| | | | 257/40 |
| 2014/0197507 A1* | 7/2014 | Assefa | H01L 31/0745 |
| | | | 438/69 |
| 2015/0091093 A1* | 4/2015 | Bouche | H01L 29/45 |
| | | | 257/369 |
| 2015/0268417 A1* | 9/2015 | Assefa | H01L 27/1461 |
| | | | 385/14 |
| 2016/0027848 A1* | 1/2016 | Liu | H10K 59/38 |
| | | | 257/40 |
| 2017/0149006 A1* | 5/2017 | Park | H10K 50/167 |
| 2018/0212177 A1 | 7/2018 | Holloway et al. | |
| 2018/0254421 A1* | 9/2018 | Kinge | H10K 30/35 |
| 2018/0309078 A1* | 10/2018 | Ju | H10K 71/421 |
| 2018/0351125 A1* | 12/2018 | He | H10K 50/16 |
| 2019/0189945 A1* | 6/2019 | Chung | H10H 20/812 |
| 2019/0198796 A1* | 6/2019 | Kim | H10K 50/12 |
| 2019/0288230 A1* | 9/2019 | Kim | H10K 50/15 |
| 2019/0312222 A1* | 10/2019 | Zhou | H10K 50/115 |
| 2023/0105598 A1* | 4/2023 | Kim | H10K 59/38 |
| | | | 257/40 |
| 2023/0139500 A1* | 5/2023 | Kim | C09K 11/883 |
| | | | 362/84 |
| 2023/0192975 A1* | 6/2023 | Wang | C08K 3/30 |
| | | | 428/220 |

* cited by examiner

LIGHT-EMITTING ELEMENT, LIGHT-EMITTING DEVICE, AND MANUFACTURING METHOD OF LIGHT-EMITTING ELEMENT FOR IMPROVING ELECTRON TRANSPORT EFFICIENCY

TECHNICAL FIELD

The disclosure relates to a light-emitting element containing quantum dots, and a light-emitting device that includes the light-emitting element.

BACKGROUND ART

Patent Literature 1 describes a light-emitting element that includes a luminous layer containing quantum dots, and an electron transport layer containing inorganic nanoparticles.

CITATION LIST

Patent Literature

Patent Literature 1: Japanese Translation of PCT International Application Publication No. 2018-517247

SUMMARY

Technical Problem

In the light-emitting element disclosed by Patent Literature 1, the quantum dots within the luminous layer are in contact with the inorganic nanoparticles within the electron transport layer, thus bringing the luminous layer and electron transport layer into contact with each other. Contact between the luminous layer and electron transport layer hence constitutes contact between nanoparticles, and the area of contact between them is reduced, thus lowering the efficiency of electron transport from the electron transport layer to the luminous layer.

Solution to Problem

To solve the above problem, a light-emitting element according to one aspect of the disclosure includes, in sequence, an anode, a hole transport layer, a luminous layer containing a plurality of quantum dots, an electron transport layer, and a cathode. The electron transport layer includes a plurality of inorganic nanoparticles having electron transportability, and an organic layer having electron transportability. The organic layer partly contains the plurality of inorganic nanoparticles, and includes a plurality of first hollows in an interface adjacent to the luminous layer. The plurality of first hollows are filled with the plurality of quantum dots.

To solve the above problem, a method for manufacturing a light-emitting element according to one aspect of the disclosure includes the following steps: forming an anode; forming a hole transport layer; forming a luminous layer containing a plurality of quantum dots; forming an electron transport layer; and forming a cathode. The electron transport layer includes a plurality of inorganic nanoparticles having electron transportability, and an organic layer having electron transportability. The organic layer partly contains the plurality of inorganic nanoparticles. The step of forming the electron transport layer includes forming a plurality of first hollows in an interface of the organic layer adjacent to the luminous layer. The plurality of first hollows are filled with the plurality of quantum dots.

Advantageous Effect of Disclosure

The light-emitting element according to the aspects of the disclosure, which includes a luminous layer containing quantum dots, and an electron transport layer containing inorganic nanoparticles, increases the area of contact between the luminous layer and electron transport layer, thus improving the efficiency of electron transport form the electron transport layer to the luminous layer.

DESCRIPTION OF EMBODIMENTS

First Embodiment

Figure 1:
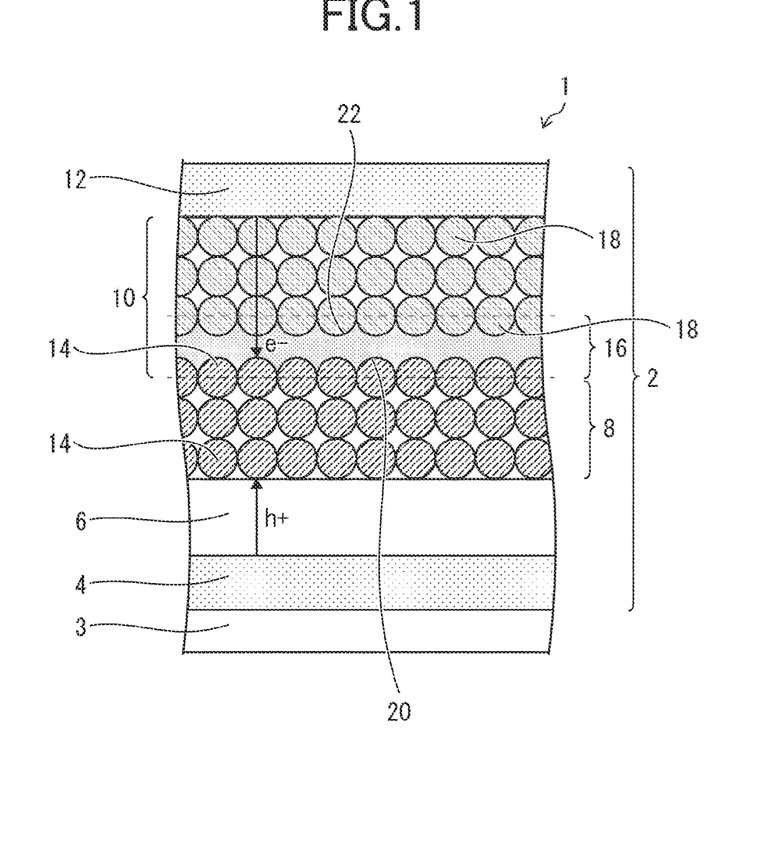
FIG. 1 is a schematic sectional view of a light-emitting device according to a first embodiment of the disclosure.

FIG. 1 is a schematic sectional view of a light-emitting device 1 according to this embodiment. As illustrated in FIG. 1, the light-emitting device 1 according to this embodiment includes a light-emitting element 2 and an array substrate 3. The light-emitting device 1 has a stack of layers of the light-emitting element 2 on the array substrate 3 with thin-film transistors (TFTs) not shown thereon. The Specification defines a direction from the light-emitting element 2 to array substrate 3 of the light-emitting device 1 as a "down direction" and defines a direction from the array substrate 3 to light-emitting element 2 of the light-emitting device 1 as an "up direction". The Specification also defines the schematic sectional view of the light-emitting device 1 as the schematic sectional view of the light-emitting device 1 at a location corresponding to that shown in FIG. 1. The Specification also defines a particle diameter or average particle diameter as a mean value of particle diameters.

The light-emitting element 2 includes the following components stacked on an anode 4 sequentially from the bottom: a hole transport layer 6, a luminous layer 8, an electron transport layer 10, and a cathode 12. The anode 4 of the light-emitting element 2 on the array substrate 3 is electrically connected to the TFTs on the array substrate 3.

The following details each layer of the light-emitting element 2.

The anode 4 and cathode 12 contain a conductive material and are respectively connected to the hole transport layer 6 and electron transport layer 10.

The anode 4 may contain a transparent material, including tin-doped indium oxide (ITO), zinc-doped indium oxide (IZO), aluminum-doped zinc oxide (AZO), gallium-doped zinc oxide (GZO), and antimony-doped tin oxide (ATO). To improve the efficiency of hole injection from the anode 4 to the hole transport layer 6, the anode 4 is preferably made of a material having a relatively large work function such as the foregoing materials.

The cathode 12 preferably contains, but not limited to, Al, Ag, Ba, Yb, Ca, Li—Al alloy, Mg—Al alloy, Mg—Ag alloy, Mg—In alloy, or Al—$Al_2O_3$ alloy. The cathode 12 in this case is a reflective electrode. To improve the efficiency of electron injection from the cathode 12 to the electron transport layer 10, the cathode 12 is preferably made of a material having a relatively small work function such as the foregoing materials.

As earlier described, this embodiment provides the anode 4 serving as a transparent electrode for instance, and the cathode 12 serving as a reflective electrode for instance. The light-emitting device 1 in this case is a bottom-emission light-emitting device that extracts, via the array substrate 3, light emitted from the luminous layer 8. The array substrate 3 in this case preferably includes, but not limited to, a glass substrate having high light transparency.

Alternatively, this embodiment may provide the anode 4 serving as a reflective electrode for instance, and the cathode 12 serving as a transparent electrode for instance. The light-emitting device 1 in this case is a top-emission light-emitting device that extracts, via the cathode 12, light emitted from the luminous layer 8. The array substrate 3 in this case may include, but not limited to, a plastic substrate having low light transparency. To improve an aperture ratio, the light-emitting device 1 is preferably a top-emission light-emitting device.

The hole transport layer 6 transports holes from the anode 4 to the luminous layer 8. The hole transport layer 6 may be made of an organic material or inorganic material. For an organic one, the material preferably contains a conductive polymer material and other things. The hole transport layer 6 may contain, but not limited to, poly [(9,9-dioctylfluorenyl-2,7-diyl)-co-(4,4'-(N-(4-sec-butylphenyl) diphenylamine)) (TFB) as a hole transport material.

The light-emitting element 2 in this embodiment may include a hole injection layer, which transports holes from the anode 4 to the hole transport layer 6, between the anode 4 and hole transport layer 6. Such a hole injection layer can be made of, but not limited to, a compound of poly (3,4-ethylenedioxythiophene):polystyrenesulfonic acid (e.g., PEDOT:PSS). However, such a hole injection layer does not have to be provided when the hole transport layer 6 alone can sufficiently supply holes from the anode 4 to the luminous layer 8, like the light-emitting element 2 according to this embodiment.

The luminous layer 8 contains a plurality of quantum dots (semiconductor nanoparticles) 14. The luminous layer 8 may be a laminate of several luminous layers. The quantum dots 14 do not have to be arranged orderly within the luminous layer 8; they may be contained in the luminous layer 8 disorderly, as illustrated in FIG. 1. The luminous layer 8 is preferably 2 to 100 nm thick.

The quantum dots 14 are light-emitting materials having a valence band level and a conduction band level; holes of the valence band level and electrons of the conduction band level rejoin together, thus emitting light. Quantum confinement causes light emitted from the quantum dots 14 to have a narrow spectrum, thus enabling light of relatively deep chromaticity to be obtained.

The material of the quantum dots 14 may be selected, as appropriate, from among materials used in the field. For instance, the quantum dots 14 are preferably made of the following materials: a Ga-based material including Si;Se; GaN, GaP, $Ga_2O_3$, and $Ga_2S_3$; a Cd-based material including Ge;CdS, CdSe, CdTe and CdO; an In-based material including InP, InN, $In_2S_3$, InGaN, AlInN, AlGaInN, $AgInS_2$, $CuInS_2$, and CuInGa; a Zn-based material including ZnS, ZnSe, ZnTe, ZnSeTe, and ZnO; a Sn-based material including SnS, SnSe and SnTe; and a Pb-based material including PbS, Pb Se, and PbTe. Alternatively, the quantum dots 14 are preferably made of any of these mixtures.

To improve the efficiency of external quanta in the light-emitting element 2, the quantum dots 14 each preferably have a core-shell structure for instance, which consists of a core and a shell, which is an envelope of the core. To also improve the dispersibility of the quantum dots 14, the luminous layer 8 preferably further includes ligands coordinating with the outermost layers of the quantum dots 14.

The quantum dots 14 each have a particle diameter of about 2 to 20 nm. The particle diameter of the quantum dots 14 can thus regulate the wavelength of light emitted from the quantum dots 14. Accordingly, controlling the particle diameter of the quantum dots 14 can regulate the wavelength of light emitted by the light-emitting device 1.

The electron transport layer 10 transports electrons from the cathode 12 to the luminous layer 8. The electron transport layer 10 in this embodiment includes an organic layer 16 having electron transportability, and a plurality of inorganic nanoparticles 18 having electron transportability.

Figure 2:
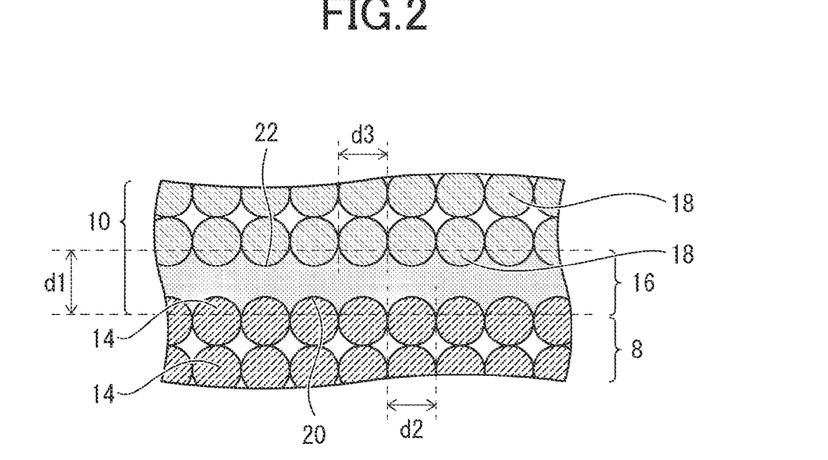
FIG. 2 is a schematic enlarged sectional view near an organic layer of the light-emitting device according to the first embodiment of the disclosure.

Referring to FIG. 2, which is an enlarged view near the organic layer 16 in FIG. 1, the organic layer 16 in this embodiment has an interface adjacent to the luminous layer 8. This interface extends along a surface of the quantum dots 14 adjacent to the cathode 12 in the luminous layer 8. The surface of the luminous layer 8 adjacent to the cathode 12 has a plurality of asperities due to the shape of the quantum dots 14. The organic layer 16 thus includes first hollows 20 in its interface adjacent to the luminous layer 8. The first hollows are filled with the quantum dots 14.

That is, the organic layer 16 is in contact with the quantum dots 14 of the luminous layer 8 in the first hollows 20, which are arranged in the interface adjacent to the luminous layer 8. The area of contact between the quantum dots 14 and organic layer 16 is hence larger than that in an instance where the quantum dots 14 and inorganic nanoparticles 18 are in direct contact with each other. That is, the area of contact between the luminous layer 8 and electron transport layer 10 in the this embodiment is larger than that in an instance where the electron transport layer 10 consisting of only the inorganic nanoparticles 18 is disposed on the luminous layer 8 containing the quantum dots 14.

The organic layer 16 also partly contains the inorganic nanoparticles 18. In this embodiment in particular, the other interface of the organic layer 16 adjacent to the cathode 12 extends along a surface of the inorganic nanoparticles 18 adjacent to the luminous layer 8. The surface of the inorganic nanoparticles 18 adjacent to the luminous layer 8 has a plurality of asperities due to the shape of the inorganic nanoparticles 18. The organic layer 16 thus includes second hollows 22 in its interface adjacent to the cathode 12. The second hollows 22 are filled with the inorganic nanoparticles 18.

That is, the organic layer 16 is in contact with the inorganic nanoparticles 18 in the second hollows 22, which are arranged in the interface adjacent to the cathode 12. The area of contact between the organic layer 16 and inorganic nanoparticles 18 is hence larger than the area of contact for an instance where nanoparticles are in contact with each other.

The difference between the energy level at the conduction-band lower end of the electron transport material included in the organic layer 16 and the energy level at the conduction-band lower end of the core of each quantum dot 14 is preferably equal to or smaller than 1 eV. The electron transport material of the organic layer 16 preferably contains at least one compound selected from the group consisting of 1,3,5-tris(1-phenyl-1H-benzimidazol-2-yl)benzene, 3-(biphenyl-4-yl)-5-(4-tert-butylphenyl)-4-phenyl-4H-1,2,4-triazole, bathophenanthroline, and tris(2,4,6-trimethyl-3-(pyridin-3-yl)phenyl)borane. This configuration can reduce the drive voltage of the light-emitting element 2 or improve the efficiency of electron injection from the electron transport layer 10 to the luminous layer 8.

The inorganic nanoparticles 18 preferably include a metal oxide containing at least one of Zn, Mg, Ti, Si, Sn, W, Ta, Ba, Zr, Al, Y, and Hf. To improve electron mobility in the electron transport layer 10, the inorganic nanoparticles 18 are preferably, but not limited to, ZnO-containing nanoparticles.

The inorganic nanoparticles 18 each preferably have a particle diameter of 2 to 30 nm inclusive. The particle diameter of each inorganic nanoparticle 18 is 2 nm or more, thus facilitating regulating the particle diameter of the inorganic nanoparticle 18. The particle diameter of each inorganic nanoparticle 18 is 30 nm or less, thus improving the efficiency of electron injection from the cathode 12 to the electron transport layer 10.

The electron transport layer 10 has a layer excluding the organic layer 16, that is, an inorganic electron transport layer composed of the inorganic nanoparticles 18 and made of only an inorganic electron transport material. The inorganic electron transport layer preferably has a thickness of 20 to 100 nm inclusive. The inorganic electron transport layer more preferably has a thickness of 40 to 80 nm inclusive. The thickness of the inorganic electron transport layer is 20 nm or more, thus sufficiently offering, to the inorganic electron transport layer, the function of blockage so that holes transported from the anode 4 to the luminous layer 8 are not transported to the cathode 12. In addition, the thickness of the inorganic electron transport layer is preferably 40 nm or more in order to improve the efficiency of electron injection from the cathode 12 to the electron transport layer 10. In addition, the thickness of the inorganic electron transport layer is 100 nm or less, thus contributing to reduction in the overall resistance of the light-emitting element 2, thus further improving the efficiency of light emission.

In some embodiments, the light-emitting element 2 may further include an electron blockage layer disposed between the hole transport layer 6 and luminous layer 8 and capable of inhibiting electron transport from the luminous layer 8 to the hole transport layer 6. Likewise, the light-emitting element 2 may further include a hole blockage layer disposed between the luminous layer 8 and electron transport layer 10 and capable of inhibiting hole transport from the luminous layer 8 to the electron transport layer 10. The light-emitting element 2 includes an electron blockage layer or hole blockage layer, thus enhancing the probability of electron-and-hole rejoining within the luminous layer 8, thus improving the efficacy of light emission.

In some embodiments, the light-emitting device 1 may include a sealant for sealing the light-emitting element 2. The sealant preferably has a hollow shape covering the upper surface of the cathode 12 of the light-emitting element 2 and covering a side surface extending from the anode 4 to cathode 12 of the light-emitting element 2. The sealant may be joined to the array substrate 3.

The electron transport layer 10 in this embodiment includes a layer filled with the organic layer 16 between the interface of the luminous layer 8 adjacent to the cathode 12 and the interface of the electron transport layer 10 adjacent to the anode 4. Here, the luminous layer 8 contains the quantum dots 14, and the electron transport layer 10 contains the inorganic nanoparticles 18. That is, the electron transport layer 10 according to this embodiment may include the organic layer 16 having a layer with no quantum dots 14 and no inorganic nanoparticles 18 This can prevent contact between the quantum dots 14 and inorganic nanoparticles 18 with more certainty.

Figure 3:
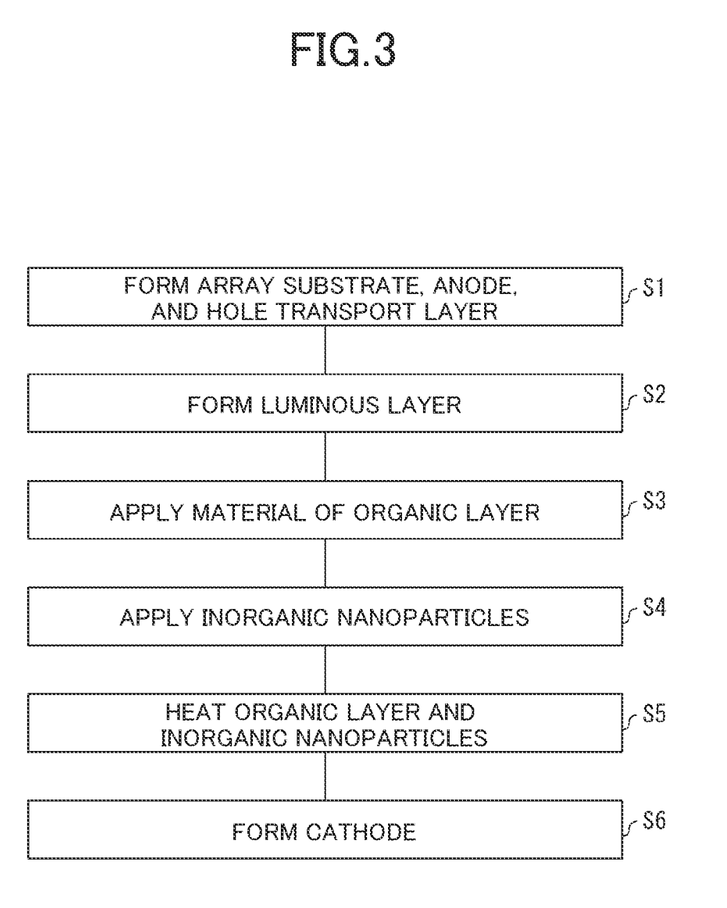
FIG. 3 is a flowchart illustrating a method for manufacturing the light-emitting device according to the first embodiment of the disclosure.
Figure 4:
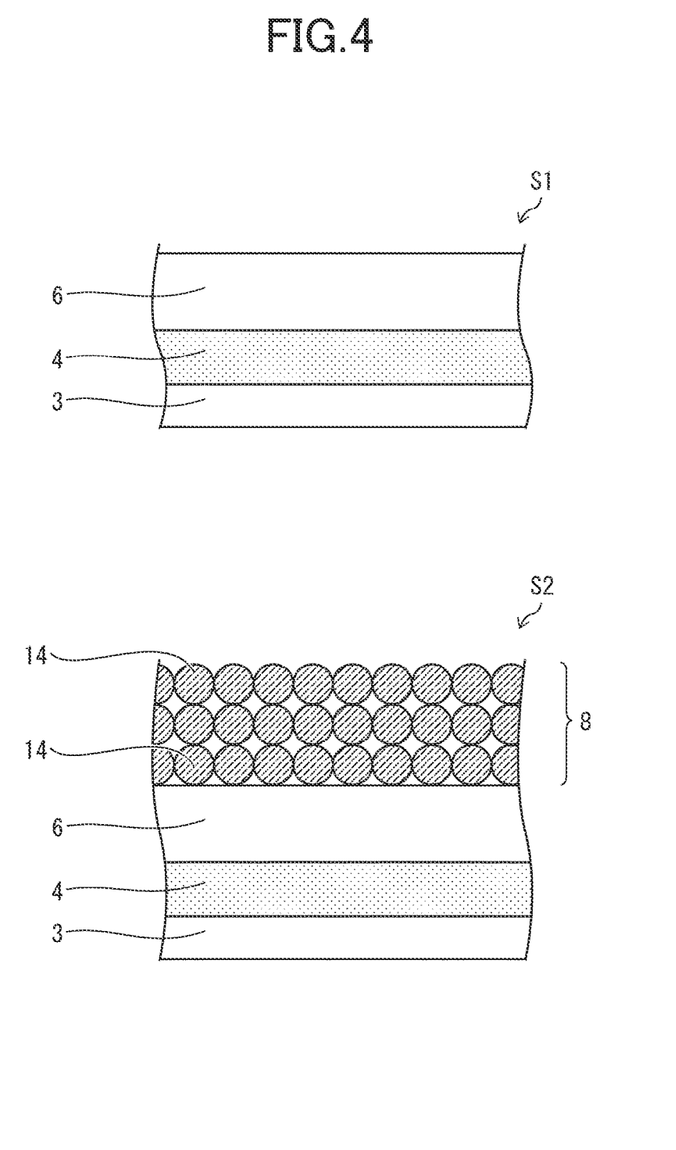
FIG. 4 illustrates, in a sectional view, a process step included in the method for manufacturing the light-emitting device according to the first embodiment of the disclosure.
Figure 5:
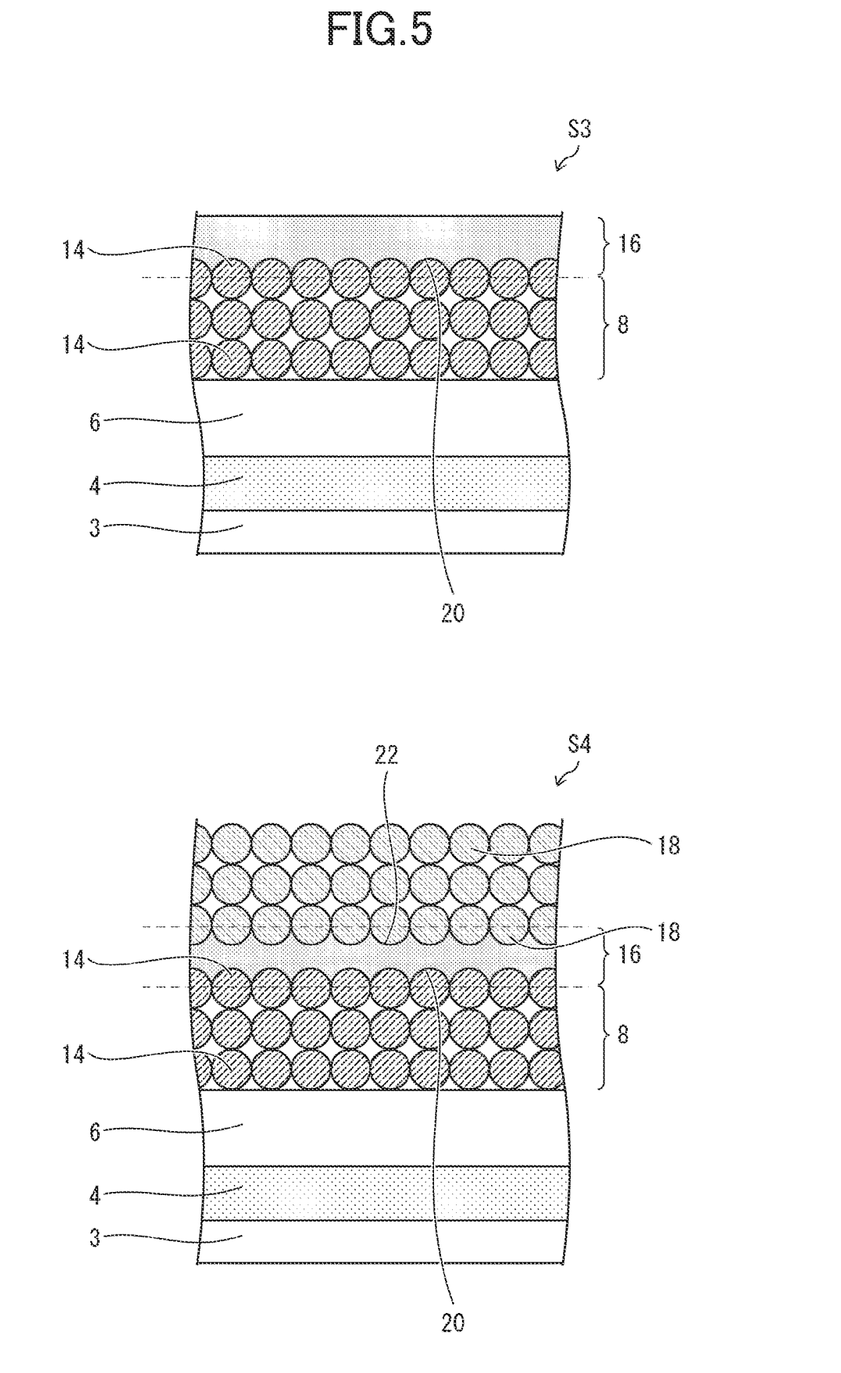
FIG. 5 illustrates, in a sectional view, another process step included in the method for manufacturing the light-emitting device according to the first embodiment of the disclosure.
Figure 6:
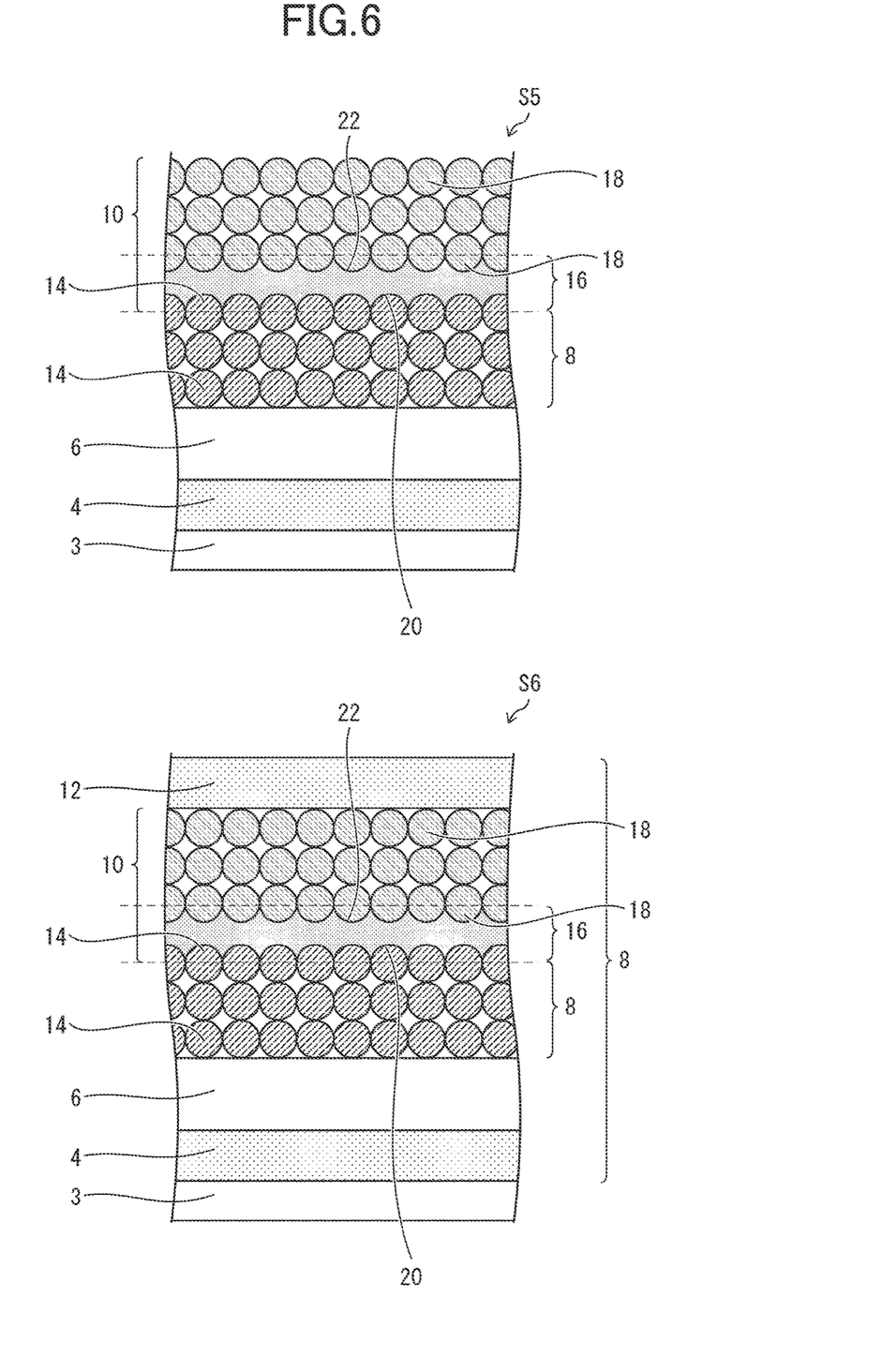
FIG. 6 illustrates, in a sectional view, another process step included in the method for manufacturing the light-emitting device according to the first embodiment of the disclosure.

FIG. 3 is a flowchart illustrating a method for manufacturing the light-emitting device 1 according to this embodiment. FIGS. 4 to 6 illustrate, in a sectional view, process steps included in the method for manufacturing the light-emitting device 1 based on the flowchart of FIG. 3, and these drawings are sectional views at a location corresponding to the schematic sectional view of FIG. 1. With reference to FIGS. 3 to 6, the method for manufacturing the light-emitting device 1 according to this embodiment will be detailed.

The method for manufacturing the light-emitting device 1 according to this embodiment includes Step S1 of forming the array substrate 3, then the anode 4, and then the hole transport layer 6. Forming the array substrate 3, the anode 4, and the hole transport layer 6 may use a publicly known method.

The array substrate 3 may be formed by fabricating TFTs onto a transparent glass substrate for instance.

The anode 4 may be formed onto the array substrate 3 through a method, such as sputtering, film evaporation, vacuum evaporation, or physical vapor deposition (PVD). To be specific, the anode 4 may be formed by, for instance, forming a 100 nm thick ITO film through sputtering.

The hole transport layer 6 may be formed onto the anode 4 through a method, such as sputtering, vacuum evaporation, physical vapor deposition, spin coating, or an ink-jet method. To be specific, a 40 nm thick TFB film may be formed as the hole transport layer 6 by, for instance, applying a TFB solution through spin coating, followed by volatilizing the solvent of the TFB solution through heating.

When the light-emitting element 2 further includes a hole injection layer, the hole injection layer may be formed onto the anode 4 after the anode 4 is formed, through a method similar to the method of forming the hole transport layer 6. In this case, a 40 nm thick PEDOT;PSS film may be formed as the hole injection layer by applying a PEDOT;PSS solution through spin coating, followed by volatilizing the solvent of the PEDOT;PSS solution through heating.

The next is Step S2 of stacking the quantum dots 14 onto the hole transport layer 6 to form the luminous layer 8. The luminous layer 8 may be formed by applying, through spin coating or an ink-jet method, a solution with the quantum dots 14 dispersed in its solvent, such as hexane or toluene. The solution may contain a dispersive material, such as thiol or amine. Further, the solution may undergo addition of a photosensitive resin, followed by patterning the applied solution through photolithography.

To be specific, a 30 nm thick luminous layer may be formed by, for instance, applying a ZnSe-based solution containing the quantum dots 14 through spin coating, followed by volatizing the solvent of the solution containing the quantum dots 14 through heating. To volatilize the solvent of the solution containing the quantum dots 14 sufficiently, and to reduce degradation in the quantum dots 14, the solution containing the quantum dots 14 is preferably heated at 60 to 150 degrees Celsius inclusive.

The next step is forming the electron transport layer 10. Forming the electron transport layer 10 includes Step S3 of forming the organic layer 16 onto the stacked quantum dots 14. The organic layer 16 is preferably formed through a method, such as spin coating, an ink-jet method, or vacuum evaporation. To be specific, a TPBi solution may be applied through spin coating for instance. The organic layer 16 is accordingly formed so as to extend along the asperities on the surface of the quantum dots 14, which are arranged on the upper surface of the luminous layer 8. This forms the first hollows 20, filled with the quantum dots 14, in the interface of the organic layer 16 adjacent to the luminous layer 8.

When formed through spin coating for instance, the organic layer 16 is preferably made of an electron transport material having a viscosity of 0.2 to 10 cP inclusive. The viscosity of the electron transport material of the organic layer 16 is 0.2 cP or more, thus avoiding the material from excessive scattering resulting from the spin coating, thus lowering an extreme reduction in the thickness of the organic layer 16. In addition, the viscosity of the electron transport material of the organic layer 16 is 10 cP or less, thus enabling the organic layer 16 to be formed along the asperities on the surface of the quantum dots 14 with more certainty, thus further increasing the area of contact between the luminous layer 8 and electron transport layer 10.

The next is Step S4 of applying the inorganic nanoparticles 18 onto the organic layer 16. The inorganic nanoparticles 18 are preferably applied through a method, such as spin coating or an ink-jet method. To be specific, a solution containing ZnO nanoparticles as the inorganic nanoparticles 18 may be applied through spin coating for instance. Here, the inorganic nanoparticles 18, when applied, partly sink into the organic layer 16, because the electron transport material of the organic layer 16 is softer than the inorganic nanoparticles 18. This forms the second hollows 22, filled with the inorganic nanoparticles 18, in the interface of the organic layer 16 opposite to the interface adjacent to the luminous layer 8.

The electron transport material of the organic layer 16 preferably has a viscosity of 10 cP or less in order to form the organic layer 16 along the asperities on the surface of the inorganic nanoparticles 18 with more certainty, and to further increase the area of contact between the organic layer 16 and inorganic nanoparticles 18.

The final step is Step S5 of heating the organic layer 16 and the inorganic nanoparticles 18 collectively to form the electron transport layer 10. The organic layer 16 and the inorganic nanoparticles 18 are preferably heated at 60 to 150 degrees Celsius inclusive, like the heating temperature of the solution of the quantum dots 14. This reduces degradation in not only the organic layer 16 but also in the quantum dots 14, which are in a lower position, and achieves a temperature sufficient to volatilize the solvent of the solution containing the electron transport material of the organic layer 16, and to volatize the solvent of a solution containing the inorganic nanoparticles 18. To be specific, the electron transport layer 10 including a 5 nm thick TPBi film and a 50 nm thick ZnO nanoparticle film may be formed by heating a TPBi solution applied and a ZnO nanoparticle solution applied, followed by volatilizing the solvents of these solutions.

As described above, the electron transport layer 10 in this embodiment is preferably formed by applying the inorganic nanoparticles 18 before volatilizing the solvent of a solution containing the electron transport material of the organic layer 16, followed by heating the organic layer 16 and the inorganic nanoparticles 18 collectively. This configuration enables the inorganic nanoparticles 18 to partly sink into the organic layer organic layer more efficiently, thus forming the second hollows 22 more efficiently, thereby increasing the area of contact between the organic layer 16 and inorganic nanoparticles 18.

Some embodiments may include applying a solution containing the electron transport material of the organic layer 16, followed by volatizing the solvent of the solution, followed by applying a solution containing the inorganic nanoparticles 18. The organic layer 16 in this case is softer than the inorganic nanoparticles 18, and the inorganic nanoparticles 18 hence partly sink into the organic layer 16, thus enabling the second hollows 22 to be formed.

Forming the electron transport layer 10 is followed by Step S6 of forming the cathode 12. The cathode 12 may be formed through a method, such as sputtering, film evaporation, vacuum evaporation, or physical vapor deposition. To be specific, the cathode 12 may be formed by, for instance, forming a 100 nm thick Al film through vacuum evaporation.

The light-emitting device 1 according to this embodiment is manufacture through the foregoing process steps. In some embodiments, Step S6 may be further followed by formation of a sealant. The sealant may be formed by, for instance, applying an epoxy adhesive in a nitrogen atmosphere.

The light-emitting element 2 according to this embodiment includes the organic layer 16 disposed between the quantum dots 14 of the luminous layer 8 and the inorganic nanoparticles 18 of the electron transport layer 10 and partly containing the inorganic nanoparticles 18. This configuration can considerably reduce the probability of direct contact between the quantum dots 14 of the luminous layer 8 and the inorganic nanoparticles 18 of the electron transport layer 10. This configuration can also considerably reduce the area of contact between the quantum dots 14 and inorganic nanoparticles 18 even when the quantum dots 14 and the inorganic nanoparticles 18 are brought into direct contact with each other.

The organic layer 16 in this embodiment includes the first hollows 20 in the interface adjacent to the luminous layer 8. The first hollows 20 are filled with the quantum dots 14. The organic layer 16 is thus in contact with the quantum dots 14 of the luminous layer 8 along the surface of the first hollows 20.

In this configuration, the light-emitting element 2 according to this embodiment has an increased area of contact between the luminous layer 8 and electron transport layer 10 when compared to a light-emitting element that includes the quantum dots 14 and inorganic nanoparticles 18 being in direct contact with each other. This increases the efficiency of electron transport from the electron transport layer 10 to the luminous layer 8, and by extension, improves the efficiency of light emission in the light-emitting element 2.

An inorganic electron transport layers containing inorganic nanoparticles and other substances typically have higher electron mobility than an organic electron transport layers containing an organic electron transport material. Hence, the light-emitting element 2 according to this embodiment further improves the efficiency of electron transport within the electron transport layer 10 than an instance where the electron transport layer 10 consists of only the organic layer 16.

The organic layer 16 in this embodiment also includes the second hollows 22 arranged in the interface adjacent to the cathode 12 and filled with the inorganic nanoparticles 18. The organic layer 16 is thus in contact with the inorganic nanoparticles 18 along the surface of the second hollows 22.

This configuration enables the light-emitting element 2 according to this embodiment to increase the area of contact between the organic layer 16 and inorganic nanoparticles 18 efficiently. This increases the efficiency of electron transport within the electron transport layer 10, and by extension, improves the efficiency of light emission in the light-emitting element 2.

The organic layer 16 preferably has a thickness d1 of 1 to 50 nm inclusive, as illustrated in FIG. 2. The thickness d1 is 1 nm or more, thereby reducing direct contact between the quantum dots 14 and inorganic nanoparticles 18 with more certainty, thus increasing the area of contact between the luminous layer 8 and electron transport layer 10 efficiently. In addition, the thickness d1 is 50 nm or less, thereby contributing to reduction in the overall resistance of the light-emitting element 2, thus further improving the efficiency of light emission.

The thickness d1 is preferably 1 nm or more in order to improve the flatness of the interface between the luminous layer 8 and electron transport layer 10. Enhanced flatness of the interface between the luminous layer 8 and electron transport layer 10 increases the efficiency of electron transport from the electron transport layer 10 to the luminous layer 8, and by extension, improves the efficiency of light emission in the light-emitting element 2.

The quantum dots 14 have an average particle diameter d2, and the inorganic nanoparticles 18 have an average particle diameter d3, as illustrated in FIG. 2. The thickness d1 in this case preferably has a value of (d2+d3)/2 or more. That is, the thickness d1 of the organic layer 16 is preferably equal to or greater than the mean value of the average particle diameter d2 of the quantum dots 14 and the average particle diameter d3 of the inorganic nanoparticles 18.

This configuration can reduce direct contact between the quantum dots 14 and inorganic nanoparticles 18 with more certainty even when the quantum dots 14 and the inorganic nanoparticles 18 sink into the organic layer 16 by about halves of their respective particle diameters. This configuration can thus increase the area of contact between the luminous layer 8 and electron transport layer 10 efficiently.

The light-emitting device 1 includes the light-emitting element 2 according to this embodiment, thus offering a light-emitting device with improved light emission efficiency.

Second Embodiment

Figure 7:
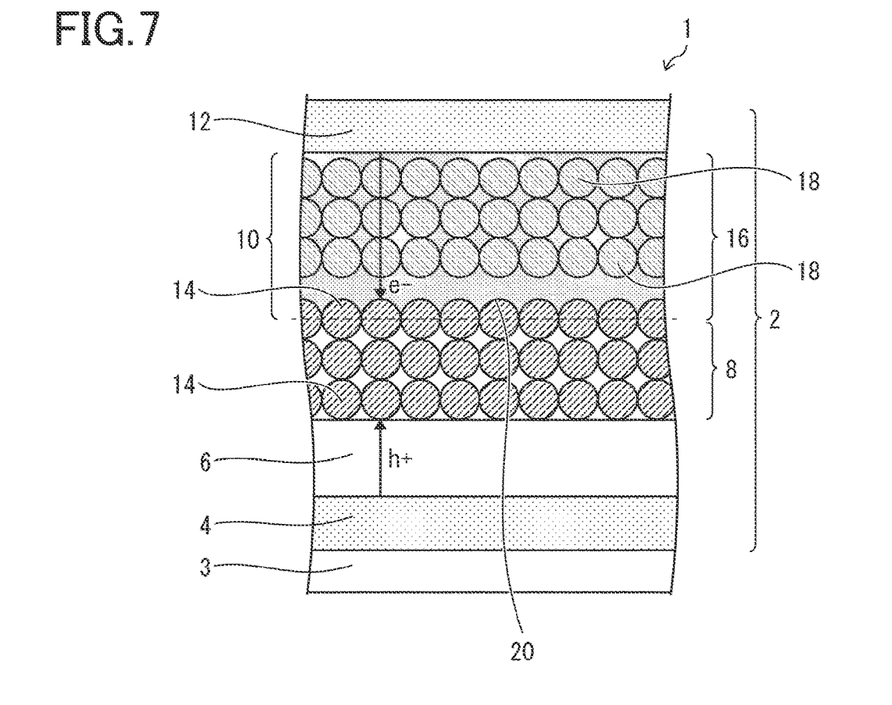
FIG. 7 is a schematic sectional view of the light-emitting device according to a second embodiment of the disclosure.

FIG. 7 is a schematic sectional view of the light-emitting device 1 according to this embodiment. The light-emitting device 1 according to this embodiment may have the same configuration as the light-emitting device 1 according to the foregoing embodiment with the exception that the configuration of the electron transport layer 10 is different.

Like the electron transport layer 10 according to the foregoing embodiment, the electron transport layer 10 in this embodiment includes the organic layer 16 and the plurality of inorganic nanoparticles 18. Here, the electron transport layer 10 in this embodiment includes the plurality of inorganic nanoparticles 18 contained in the organic layer 16. That is, the organic layer 16 in this embodiment includes the inorganic nanoparticles 18 between its interface adjacent to the luminous layer 8 and its interface adjacent to the cathode 12.

The organic layer 16 in this embodiment is in contact with the cathode 12 at the interface adjacent to the cathode 12. The organic layer 16 in this embodiment may be particularly in contact with the cathode 12 entirely at the interface adjacent to the cathode 12, as illustrated in FIG. 7. Unlike the organic layer 16 according to the foregoing embodiment, the organic layer 16 according to this embodiment has the first hollows 20 in the interface adjacent to the luminous layer 8, whereas the organic layer 16 does not have to include the second hollows 22 in the interface adjacent to the cathode 12. This embodiment may include a configuration other than this configuration; the inorganic nanoparticles 18 may be in contact with the cathode 12 as long as the organic layer 16 is at least partly in contact with the cathode 12.

The light-emitting device 1 according to this embodiment may be produced using the same method as the light-emitting device 1 according to the foregoing embodiment except for the step of forming the electron transport layer 10. The step of forming the electron transport layer 10 according to this embodiment includes applying a mixture solution containing the material of the organic layer 16 and the inorganic nanoparticles 18, followed by heating the mixture solution.

The light-emitting element 2 according to this embodiment includes the inorganic nanoparticles 18 within the organic layer 16. This further increases the area of contact between the organic layer 16 and inorganic nanoparticles 18, thus further improving the efficiency of electron transport between the organic layer 16 and inorganic nanoparticles 18.

The organic layer 16 according to this embodiment is in contact with the cathode 12 at the interface adjacent to the cathode 12. This increases the area of contact between the electron transport layer 10 and cathode 12, thus improving the efficiency of electron transport from the cathode 12 to the electron transport layer 10.

The foregoing configuration improves the flatness of the electron transport layer 10 adjacent to the cathode 12. This reduces positional unevenness in the area of contact between the electron transport layer 10 and the cathode 12, thus improving the uniformity of the emission plane of the light-emitting element 2.

In addition, the electron transport layer 10 in this embodiment is composed of a mixture solution containing the material of the organic layer 16 and the inorganic nanoparticles 18. The electron transport layer 10 can be thus formed without a process step of material application; that is, this embodiment offers less process steps than the foregoing embodiment, thereby simplifying manufacturing process steps or reducing manufacturing costs.

Third Embodiment

Figure 8:
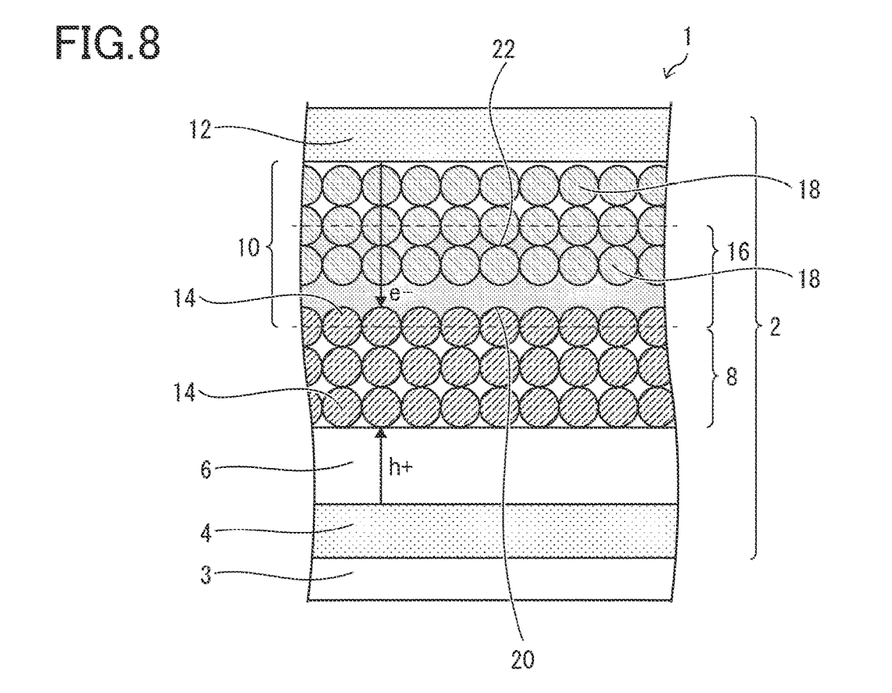
FIG. 8 is a schematic sectional view of the light-emitting device according to a third embodiment of the disclosure.

FIG. 8 is a schematic sectional view of the light-emitting device 1 according to this embodiment. The light-emitting device 1 according to this embodiment may have the same configuration as the light-emitting device 1 according to the foregoing embodiments with the exception that the configuration of the electron transport layer 10 is different.

Like the electron transport layer 10 according to the foregoing embodiments, the electron transport layer 10 in this embodiment includes the organic layer 16 and the plurality of inorganic nanoparticles 18. The electron transport layer 10 includes the plurality of inorganic nanoparticles 18 contained in the organic layer 16. Unlike the organic layer 16 in the foregoing embodiments, the organic layer 16 in this embodiment is not in contact with the cathode 12. Like the light-emitting element 2 according to the first embodiment, the light-emitting element 2 in this embodiment is configured such that the inorganic nanoparticles 18 are in contact with the cathode 12, thus establishing contact between the electron transport layer 10 and cathode 12.

Figure 9:
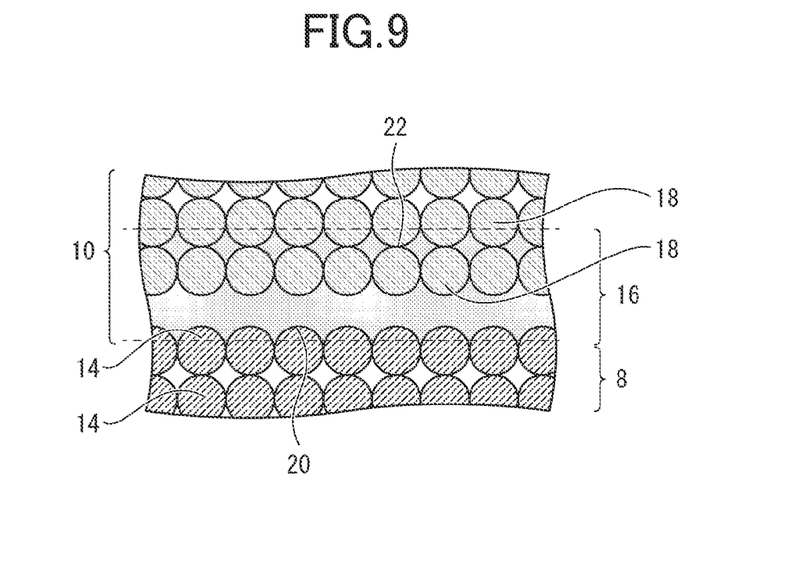
FIG. 9 is a schematic enlarged sectional view near the organic layer of the light-emitting device according to the third embodiment of the disclosure.

As shown in FIG. 9, which illustrates an enlarged view near the organic layer 16 in FIG. 8, the interface of the organic layer 16 adjacent to the cathode 12 extends along the surface of some of the inorganic nanoparticles 18. The organic layer 16 thus includes the second hollows 22 arranged in the interface adjacent to the cathode 12 and filled with the inorganic nanoparticles 18, like the organic layer 16 according to the first embodiment.

The light-emitting device 1 according to this embodiment may be produced using the same method as the light-emitting device 1 according to the foregoing embodiments except for the step of forming the electron transport layer 10. The step of forming the electron transport layer 10 according to this embodiment includes applying and heating a mixture solution containing the material of the organic layer 16 and the inorganic nanoparticles 18, followed by applying and heating a solution containing only the inorganic nanoparticles 18.

The light-emitting element 2 according to this embodiment is configured such that the organic layer 16 contains some of the inorganic nanoparticles 18, and such that the electron transport layer 10 includes a layer consisting of only an inorganic electron transport material. This can improve the efficiency of electron transport within the electron transport layer 10 while increasing the area of contact between the luminous layer 8 and electron transport layer 10 and improving the efficiency of electron transport from the electron transport layer 10 to the luminous layer 8.

Fourth Embodiment

Figure 10:
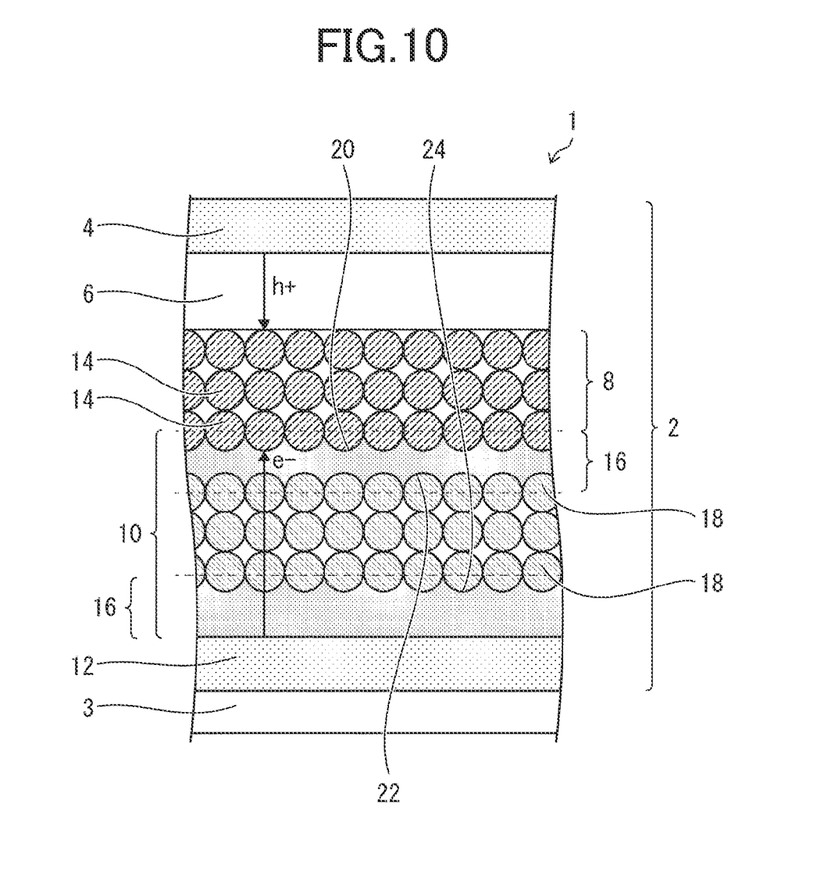
FIG. 10 is a schematic sectional view of the light-emitting device according to a fourth embodiment of the disclosure.

FIG. 10 is a schematic sectional view of the light-emitting device 1 according to this embodiment. The light-emitting device 1 according to this embodiment is different from the light-emitting device 1 according to the first embodiment in that the components of the light-emitting element 2 are arranged upside-down. That is, the light-emitting device 1 according to this embodiment includes the following stacked sequentially from the bottom: the array substrate 3, the cathode 12, the electron transport layer 10, the luminous layer 8, the hole transport layer 6, and the anode 4.

The light-emitting element 2 according to this embodiment is different from the light-emitting element 2 according to the first embodiment in that the organic layer 16 is provided that is in contact with the inorganic nanoparticles 18 adjacent to the cathode 12 and with the cathode 12. The organic layer 16 being in contact with the cathode 12 thus includes third hollows 24 arranged in its interface adjacent to the luminous layer 8. The third hollows are filled with the inorganic nanoparticles 18.

Except for the foregoing, the light-emitting device 1 according to this embodiment is configured in the same manner as the light-emitting device 1 according to the first embodiment. Each layer of the light-emitting device 1 according to this embodiment may be made of the same material as the corresponding layer of the light-emitting device 1 according to each of the foregoing embodiments.

The light-emitting device 1 according to this embodiment may be manufactured by forming the array substrate 3, followed by sequentially forming the cathode 12, the electron transport layer 10, the luminous layer 8, the hole transport layer 6, and the anode 4.

Forming the electron transport layer 10 according to this embodiment includes applying and heating, in sequence, the organic layer 16 that is brought into contact with the cathode 12, the inorganic nanoparticles 18, and the organic layer 16 that is brought into contact with the luminous layer 8. A method of applying the material of each layer and heating conditions may be the same as those described in the foregoing embodiments.

For these reasons, the inorganic nanoparticles 18 thus partly sink into the organic layer 16 being in contact with the cathode 12, thus forming the third hollows 24, filled with the inorganic nanoparticles 18, close to the luminous layer 8 in this organic layer 16 being in contact with the cathode 12. In addition, further applying a solution containing the material of the organic layer 16 onto the inorganic nanoparticles 18 provides the organic layer 16 that extends along the asperities on the surface of the inorganic nanoparticles 18. This forms the second hollows 22, filled with the inorganic nanoparticles 18, in the interface of the organic layer 16 adjacent to the cathode 12.

The organic layer 16 is typically softer than the quantum dots 14. Hence, applying a solution containing the quantum dots 14 after the foregoing formation of the electron transport layer 10 provides the quantum dots 14 that partly sink into the organic layer 16. This forms the first hollows 20, filled with the quantum dots 14, in the interface that is adjacent to the cathode 12 in the organic layer 16 being in contact with the luminous layer 8.

Forming the electron transport layer 10 according to this embodiment preferably includes applying the material of the organic layer 16 that is brought into contact with the cathode 12, followed by applying the inorganic nanoparticles 18 and heating together the material of the organic layer 16 and the inorganic nanoparticles 18. That is, forming the electron transport layer 10 according to this embodiment preferably includes applying a solution containing the inorganic nanoparticles 18 before volatilizing the solvent of a solution containing the material of the organic layer 16 that is brought into contact with the cathode 12. This enables the inorganic nanoparticles 18 to sink into the organic layer 16 more easily, thus forming the third hollows 24 more effectively.

Forming the electron transport layer 10 according to this embodiment also preferably includes applying and heating the material of the organic layer 16 that is brought into contact with the cathode 12 as well as application and heating of the inorganic nanoparticles 18, followed by only applying the material of the organic layer 16 that is brought into contact with the luminous layer 8. That is, forming the electron transport layer 10 according to this embodiment preferably includes applying a solution containing the quantum dots 14 before volatilizing the solvent of a solution containing the material of the organic layer 16 that is brought into contact with the luminous layer 8. This enables the quantum dots 14 to sink into the organic layer 16 more easily, thus forming the first hollows 20 more effectively.

Like the light-emitting element 2 according to the foregoing embodiments, the light-emitting element 2 according to this embodiment improves the area of contact between the luminous layer 8 and electron transport layer 10 as well as the area of contact between the inorganic nanoparticles 18 and the organic layer 16 being in contact with the luminous layer 8. The light-emitting element 2 according to this embodiment, which includes the cathode 12 on the array substrate 3 and thus has an inverted structure, improves the efficiency of electron transport from the luminous layer 8 to the electron transport layer 10 as well as the efficiency of electron transport within the electron transport layer 10.

The electron transport layer 10 according to this embodiment is in contact with the cathode 12 at its interface with the cathode 12. In addition, the electron transport layer 10 includes the organic layer 16 having the third hollows 24 arranged in its interface adjacent to the luminous layer. The third hollows 24 are filled with the inorganic nanoparticles 18. This improves the area of contact between the electron transport layer 10 and cathode 12 as well as the area of contact between the inorganic nanoparticles 18 and the organic layer 16 being in contact with the cathode 12. The light-emitting element 2 according to this embodiment consequently improves the efficiency of electron transport from the cathode 12 to the electron transport layer 10 as well as the efficiency of electron transport within the electron transport layer 10.

In the light-emitting element 2 according to this embodiment, the anode 4 is formed after the other layers of the light-emitting element 2 are formed. This reduces oxidation of the anode 4 even when an Al-based metal material, which is susceptible to oxidation during the formation of the other layers of the light-emitting element 2, is used as the anode 4, thereby contributing to improvement in the overall endurance of the light-emitting element 2.

This embodiment has described an instance where the electron transport layer 10 includes two separate organic layers 16: one of the layers 16 is disposed closer to the luminous layer 8 than the inorganic nanoparticles 18 are; and the other layer 16 is disposed closer to the cathode 12 than the inorganic nanoparticles 18 are. This embodiment may include another configuration where the electron transport layer 10 includes a single organic layer 16 being in contact with both the luminous layer 8 and cathode 12 and includes the inorganic nanoparticles 18 contained in the organic layer 16. The electron transport layer 10 may be formed by applying a mixture solution containing the material of the organic layer 16 and the inorganic nanoparticles 18, followed by heating the mixture solution. In this configuration, the electron transport layer 10 can be formed through one-time application and heating, thereby simplifying manufacturing process steps or reducing manufacturing costs.

The foregoing embodiments have described an instance where the light-emitting device 1 includes only one light-emitting element 2. The foregoing embodiments may include another configuration where the light-emitting device 1 includes a plurality of light-emitting elements 2.

In this case, one of the anode 4 and cathode 12 stacked on the array substrate 3 may be provided individually for each light-emitting element 2, and the other electrode may be shared among the plurality of light-emitting elements 2. The electrode individually provided for each light-emitting element 2 may be driven individually by a TFT disposed on the array substrate 3, and by extension, the light-emitting elements 2 may emit light individually. The light-emitting device 1 can thus operate as a display device. In addition, the hole transport layer 6 and electron transport layer 10 may be also provided individually for each light-emitting element 2 or may be shared among the plurality of light-emitting elements 2.

When the light-emitting device 1 includes a plurality of light-emitting elements 2, at least one of the light-emitting elements 2 may emit light having a wavelength different from those of the other light-emitting elements 2, that is, light having a color different from those of light emitted from the other light-emitting elements 2. In other words, the luminous layer 8 may be provided individually for each light-emitting element 2, and the wavelength of light emitted by the quantum dots 14 within the luminous layer 8 may be different from each other between the light-emitting elements 2.

For instance, the light-emitting device 1 may include, as the light-emitting elements 2, a red light-emitting element that emits red light, a green light-emitting element that emits green light, and a blue light-emitting element that emits blue light. This enables the light-emitting device 1 to emit white light. Furthermore, the light-emitting device 1 configured such that the individual light-emitting elements 2 can be driven separately can operate as a display device capable of color display.

The present disclosure is not limited to the foregoing embodiments and can be modified in various manners within the scope of the claims. The technical scope of the present disclosure includes an embodiment that is obtained by combining, as appropriate, the technical means disclosed in the respective embodiments. In addition, combining the technical means disclosed in the respective embodiments can form a new technical feature.

The invention claimed is:

1. A light-emitting element comprising in sequence:
an anode;
a hole transport layer;
a luminous layer comprising a plurality of quantum dots;
an electron transport layer; and
a cathode,
wherein the electron transport layer includes
 a plurality of inorganic nanoparticles having electron transportability, and
 an organic layer having electron transportability,
the organic layer partly includes the plurality of inorganic nanoparticles,
the organic layer further includes a plurality of first hollows in an interface adjacent to the luminous layer, the plurality of first hollows being filled with the plurality of quantum dots, and
a difference between an energy level at a conduction-band lower end of an electron transport material included in the organic layer and an energy level at a conduction-band lower end of a core of each of the plurality of quantum dots is equal to or smaller than 1 eV.

2. A light-emitting element comprising in sequence:
an anode;
a hole transport layer;
a luminous layer comprising a plurality of quantum dots;
an electron transport layer; and
a cathode,
wherein the electron transport layer includes
 a plurality of inorganic nanoparticles having electron transportability, and
 an organic layer having electron transportability,
the organic layer partly includes the plurality of inorganic nanoparticles,
the organic layer further includes a plurality of first hollows in an interface adjacent to the luminous layer, the plurality of first hollows being filled with the plurality of quantum dots, and the organic layer is made of an electron transport material comprising at least one compound selected from the group consisting of 1,3,5-tris (1-phenyl-1H-benzimidazol-2-yl) benzene, 3-(biphenyl-4-yl)-5-(4-tert-butylphenyl)-4-phenyl-4H-1,2,4-triazole, bathophenanthroline, and tris (2,4,6-trimethyl-3-(pyridin-3-yl) phenyl) borane.

* * * * *